(12) United States Patent
Burnette et al.

(10) Patent No.: US 8,912,853 B2
(45) Date of Patent: *Dec. 16, 2014

(54) DYNAMIC LEVEL SHIFTER CIRCUIT AND RING OSCILLATOR USING THE SAME

(75) Inventors: James E. Burnette, San Jose, CA (US); Greg M. Hess, Mountain View, CA (US); Shinye Shiu, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 281 days.

This patent is subject to a terminal disclaimer.

(21) Appl. No.: 13/523,055

(22) Filed: Jun. 14, 2012

(65) Prior Publication Data
US 2013/0335152 A1 Dec. 19, 2013

(51) Int. Cl.
*H03K 3/03* (2006.01)
(52) U.S. Cl.
USPC .............................. 331/57; 331/185; 331/186
(58) Field of Classification Search
USPC ............................................ 331/57, 185, 186
See application file for complete search history.

(56) References Cited

U.S. PATENT DOCUMENTS

| 6,956,442 | B2 * | 10/2005 | Groen et al. | 331/57 |
|---|---|---|---|---|
| 7,719,370 | B2 * | 5/2010 | Takai | 331/57 |
| 7,924,102 | B2 * | 4/2011 | Hinrichs | 331/57 |
| 7,969,810 | B2 | 6/2011 | Keeth et al. | |
| 8,139,327 | B2 | 3/2012 | Ito et al. | |
| 8,559,247 | B2 * | 10/2013 | Shiu | 365/189.11 |
| 2009/0039846 | A1 * | 2/2009 | Ito et al. | 323/277 |
| 2009/0072914 | A1 * | 3/2009 | Murata | 331/57 |
| 2011/0102064 | A1 | 5/2011 | Noorlag et al. | |

* cited by examiner

*Primary Examiner* — Robert Pascal
*Assistant Examiner* — Jeffrey Shin
(74) *Attorney, Agent, or Firm* — Erik A. Heter; Meyertons, Hood, Kivlin, Korwert & Goetzel, P.C.

(57) ABSTRACT

A dynamic level shifter circuit and a ring oscillator implemented using the same are disclosed. A dynamic level shifter may include a pull-down circuit and a pull-up circuit. The pull-up circuit may include an extra transistor configured to reduce the current through that circuit when the pull-down circuit is activated. A ring oscillator may be implemented using instances of the dynamic level shifter along with instances of a static level shifter. The ring oscillator may also include a pulse generator configured to initiate oscillation. The ring oscillator implemented with dynamic level shifters may be used in conjunction with another ring oscillator implemented using only static level shifters to compare relative performance levels of the static and dynamic level shifters.

24 Claims, 8 Drawing Sheets

DYNAMIC LEVEL SHIFTER CIRCUIT AND RING OSCILLATOR USING THE SAME

BACKGROUND

1. Technical Field

This invention relates to electronic circuits, and more particularly, to level shifter circuits.

2. Description of the Related Art

Many modern integrated circuits (ICs) utilize multiple operating voltages. Some circuits can operate better at lower voltages, while others may function better at higher voltages. Accordingly, many ICs may include multiple power domains, each of which includes circuitry that may operate based on an appropriate supply voltage. For example, an IC having multiple power domains may include one or more processor cores that operates at a voltage of 0.8 volts, and may include a memory that operates at 1.2 volts.

Despite the different operating voltages of circuits in different power domains, it may nevertheless remain necessary for such circuits to communicate with each other. For example, the processor cores of the exemplary IC noted above may need to write data to the memory and read data therefrom. Accordingly, such reads and writes may require the transmission of signals across boundaries between two power domains operating at different voltages.

To transfer signals across boundaries of power domains, level shifter circuits may be used. A level shifter may be a static logic circuit that receives signals at a first voltage corresponding to a supply voltage of a first power domain, and outputs signals at a second voltage corresponding to a supply voltage of the second power domain. Level shifters may be used for shifting a voltage up (when the voltage of the second domain is greater than the first) as well as down (when the voltage of the second domain is less than the first).

SUMMARY

A dynamic level shifter circuit and a ring oscillator including the same are disclosed. In one embodiment, a dynamic level shifter includes a pull-down circuit and a pull-up circuit, both of which are coupled to an intermediate node. A precharge circuit is also coupled to the intermediate node. The precharge circuit and the pull-down circuit both include a clock input. The data input is also coupled to the pull-down circuit. During a first portion of the clock cycle, the precharge circuit is activated to precharge the intermediate node. If the data input receives a first logic level during a second portion of the clock cycle, the pull-down circuit is activated and pulls the intermediate node low. If the data input receives a second logic level during the second portion of the clock cycle, the intermediate node may remain high from the precharge that occurred during the first portion of the clock cycle. The pull-up stack also includes a first transistor coupled between a voltage source and a second transistor that is part of a half-keeper circuit. When the data input receives a first logic level, the current through first transistor, and thus through the pull-up circuit, may be reduced, thereby weakening the pull-up strength and enabling the pull-down circuit to pull the intermediate node low.

In one embodiment, a ring oscillator may be constructed using dynamic level shifters such as those described above. The ring oscillator may also include a number of static level shifters. A series-coupled chain is formed using alternating instances of dynamic level shifters and the static level shifters. The output of each of the dynamic level shifters is inverted and fed back to a clock input of another one of the dynamic level shifters. The data input of each of the dynamic level shifters is coupled to an output of one of the static level shifters. All but one of the static level shifters includes an input coupled to an output of a previous dynamic level shifter. The ring oscillator also includes a pulse generator coupled between the input of the one of the static level shifters and an output of one of the dynamic level shifters. Since the dynamic level shifters and the static level shifters in the ring oscillator are non-inverting, the pulse generator is used to initiate and maintain oscillation of the ring oscillator. When an enable signal is asserted and applies to the pulse generator, a low-to-high and a subsequent high-to-low transition are generated and provided to the one of the static level shifters. These transitions are fed back to the data input of one of the dynamic level shifters, and oscillation is thus initiated. The oscillation is maintained as long as the enable signal remains asserted.

A method for testing the delay of dynamic level shifters relative to static level shifters is also disclosed. In one embodiment, the method includes operating first and second ring oscillators. The first ring oscillator includes both static and dynamic level shifters, such as that described above. The second ring oscillator includes only static level shifters. The ring oscillators may be operated as specific voltages, and their frequencies may be compared to one another. Based on the frequencies of operation of the two ring oscillators, average values of delay through an instance of the dynamic level shifters and an instance of the static level shifter may be derived and compared to one another. Multiple iterations of the test may be conducted to determine process points (e.g., different voltages) at which the dynamic level shifter no longer outperforms the static level shifter (e.g., in terms of delay) or otherwise stops functioning.

BRIEF DESCRIPTION OF THE DRAWINGS

The following detailed description makes reference to the accompanying drawings, which are now briefly described.

Figure 1:
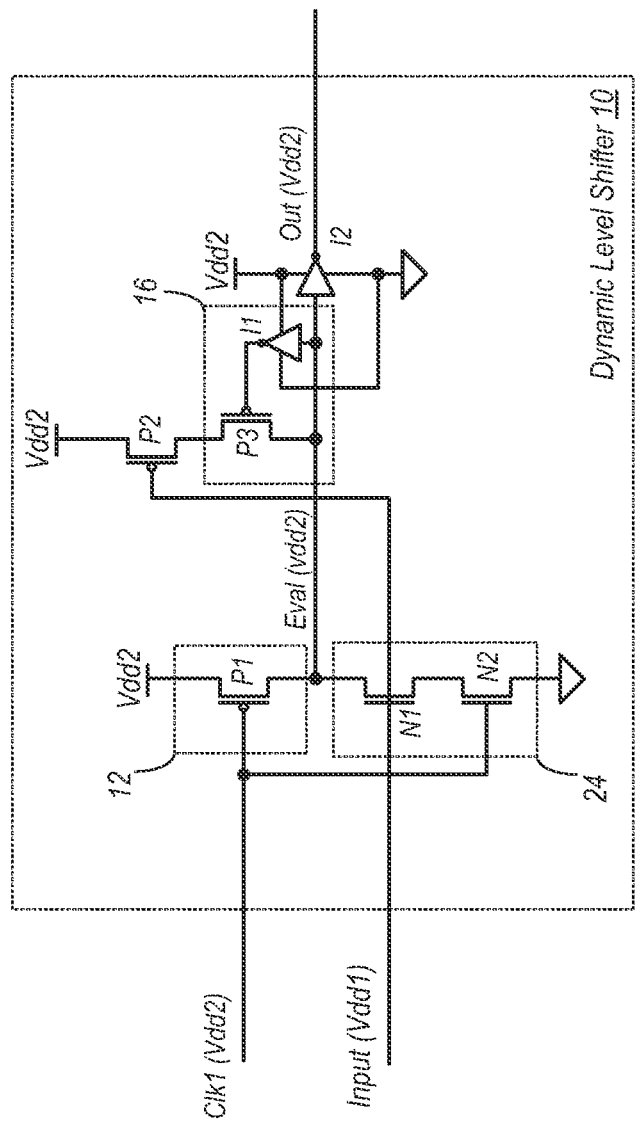
FIG. 1 is a schematic diagram of one embodiment of a dynamic level shifter.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description.

As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

FIG. 1 is a schematic diagram of one embodiment of a dynamic level shifter circuit. In the embodiment shown, dynamic level shifter 10 is configured to receive an input signal referenced to Vdd1 and to provide an output signal referenced to Vdd2. The circuit may operate under the principles of dynamic logic, wherein a first phase of a clock signal is a precharge phase, while a second phase of the clock signal is an evaluation phase. This contrasts with the operation of a static level shifter circuit, wherein the operation is not based on a clock and thus the output follows the input irrespective of any clock signal or phase thereof.

It is noted that in the illustrated embodiment, transistors designated with a 'P' (e.g., P1) are p-channel metal oxide semiconductor (PMOS) transistors. Those transistors designated with an N' in the illustrated embodiment are n-channel metal oxide semiconductor (NMOS) transistors. It is noted however that this arrangement is not intended to be limiting, and thus the particular types of transistors used for a given embodiment may be different from that shown here.

In the embodiment shown, dynamic level shifter 10 includes a precharge circuit 12, a pull-down (or evaluation) circuit 24, and a half-keeper circuit 16. Dynamic level shifter 10 also includes an inverter 12 coupled between an evaluation node ('Eval') and an output node ('Out'), which are both referenced to Vdd2. The evaluation node in the embodiment shown is an intermediate, or transfer node which may be evaluated to a logic value opposite that of the input signal, during an evaluation phase. Signals may be output by dynamic level shifter 10 at the same logic value as received during the evaluation phase. However, while the output signal is referenced to Vdd2, the input signal is referenced to Vdd1.

Precharge circuit 12 in this embodiment includes transistor P1, which is coupled to receive the clk1 signal. The clk1 signal is referenced to Vdd2, and may be provided from a static level shifter if it originates in another voltage domain. Transistor P1 may be activated responsive to receiving clk1 in its low state. When active, transistor P1 provides a pull-up path between the evaluation node and Vdd2, thus performing a precharge operation. The evaluation node may also be referred to as a transfer node via which a signal is transferred from the input node to the output node during the evaluation phase.

Pull-down circuit 24 in this embodiment includes transistors N1 and N2, which are coupled in series between the evaluation node and a reference (e.g., ground) node. The gate terminal of transistor N1 is coupled to an input node and is thus arranged to receive an input signal. An input signal conveyed on the input node is referenced to Vdd1 in this embodiment. Transistor N1 in this embodiment may be activated responsive to receiving the input signal as a logic high voltage, as referenced to Vdd1. Transistor N2 in the embodiment shown is coupled to receive clk2, and may be activated when clk1 is at a logic high voltage, as referenced to Vdd2. Since transistor P1 is active when the clk1 is low and transistor N2 is active when the clk1 is high, the cycle of clk1 may be considered to occur in a precharge phase (clk1 low) and an evaluation phase (clk1 high). When both transistors N1 and N2 are active, a pull-down path exists between the evaluation node and ground. Accordingly, the evaluation node may be evaluated as a logic low when transistors N1 and N2 are active at the same time.

Half-keeper circuit 16 in the illustrated embodiment includes transistors P3 and inverter I1, which operate in the Vdd2 domain. Transistor P3 is arranged to receive the output from inverter I1. When the evaluation node is at a logic high, inverter I1 may drive its output to a logic low, thereby causing the activation of P3. When P2 and P3 are both active while transistor N1 is inactive, the evaluation node is pulled up toward Vdd2.

The gate terminal of transistor P2 in the embodiment shown is coupled to the input node, which as noted above, is referenced to Vdd1. Thus, transistor P2 is activated responsive to the input signal being receiving as a logic low. When a logic high is received on the input node, P2 may either become activated or its current flow may be reduced relative to when a logic low is received on the input node. Since transistor N1 is referenced to Vdd1, the pull-down stack that comprises evaluation circuit 24 may not, when fully activated, have as much drive strength as the pull-up stack that comprises transistors P2 and P3. Accordingly, a logic high on P2 may reduce the drive strength of the pull-up stack by either reducing the current through P2 and P3, if not preventing the pull-up stack from driving the evaluation node altogether by de-activating P2. In either case, the drive strength of the pull-up stack may be reduced to such a point that the pull-down stack of evaluation circuit 24 may, when active, pull the evaluation node load without significant contention from the pull-up stack.

Figure 2:
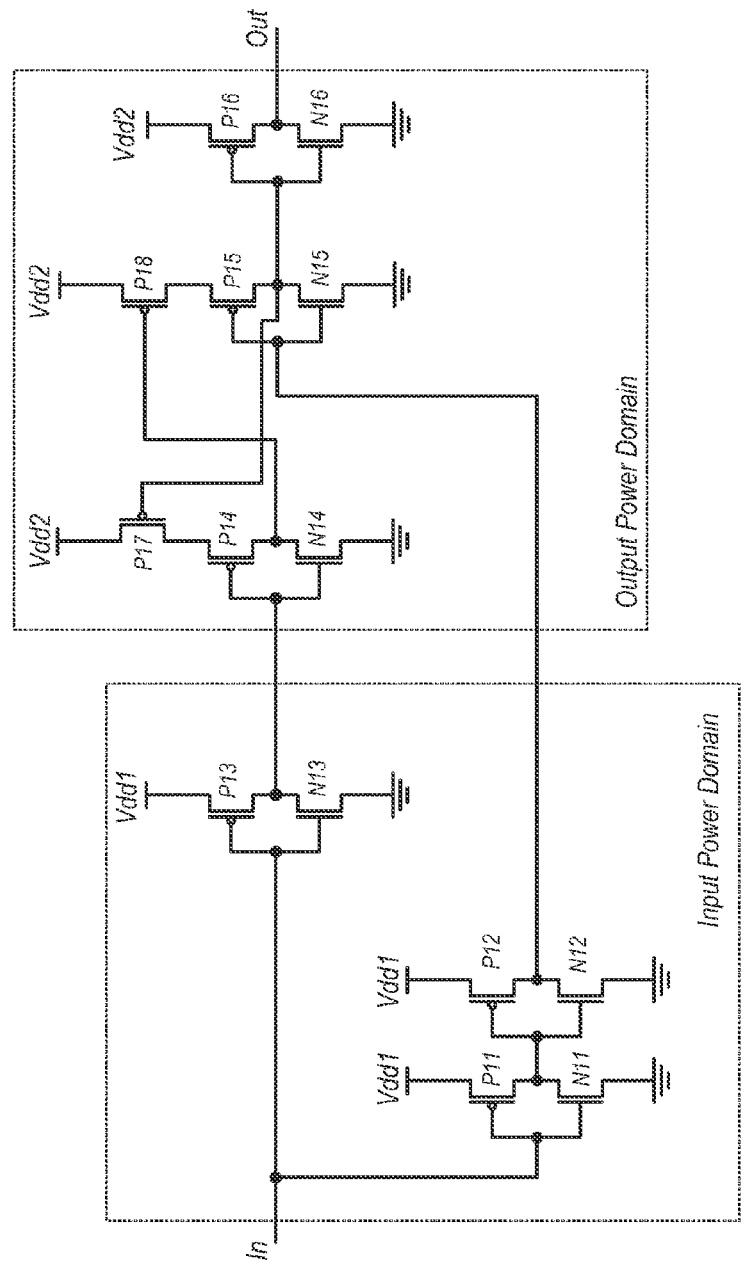
FIG. 2 is a schematic diagram of one embodiment of a static level shifter.

The present disclosure contemplates a ring oscillator that may include a number of dynamic level shifters such as that shown in FIG. 1. The ring oscillator may also include a number of static level shifters interspersed with the dynamic level shifters. FIG. 2 is a schematic diagram illustrating one embodiment of a static level shifter. In the embodiment shown, static level shifter 20 includes a first circuit in the input power domain (coupled to receive Vdd1) and a second circuit in a second power domain (Vdd2). The level shifter includes several inverter circuits. In the output power domain, two of these inverters are augmented by an extra PMOS transistor. A first of these inverters includes P17, while a second includes P18. These extra PMOS devices P17 and P18 may reduce or eliminate contention with pull-down devices N14 and N15, respectively.

It is noted that the embodiment shown in FIG. 2 is directed toward a static level shifter for transferring a signal from a lower voltage domain to a higher voltage domain. However, embodiments are possible and contemplated in which signals may be transferred from a higher voltage domain to a lower voltage domain. In such embodiments, the extra PMOS devices discussed above may be eliminated.

Figure 3:
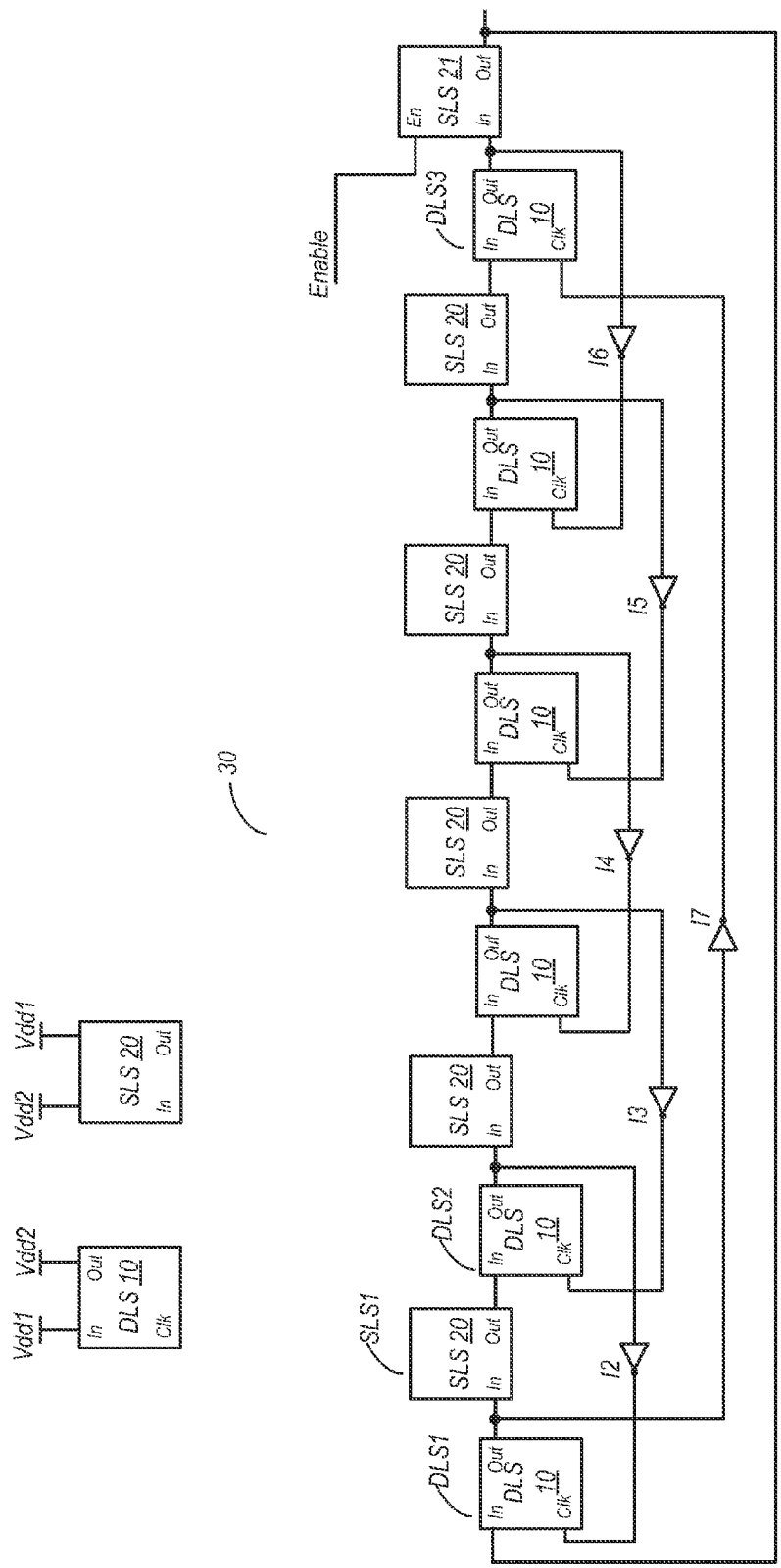
FIG. 3 is a block diagram of one embodiment of a ring oscillator implemented using dynamic and static level shifters.

FIG. 3 is a block diagram of one embodiment of a ring oscillator that includes a number of dynamic level shifters 10, a number of static level shifters 20, and one extra static level shifter 21 that includes pulse generation circuitry (which is discussed in more detail below). It is noted that particular ones of the level shifters in the embodiment shown include additional labels (e.g., DLS1, DLS2, SLS1, etc.). These labels will be used as reference to further illustrate operation of ring oscillator 30 in the timing diagram of FIG. 5.

Ring oscillator 30 in the embodiment shown is constructed using a series-coupled chain of level shifters in which the dynamic level shifters 10 and the static level shifters 20 are arranged in an alternating sequence. The output of each of the dynamic level shifters 10 is coupled to a data input of static level shifter 20/21 in the embodiment shown. Similarly, the output of each of the static level shifters 20/21 is coupled to a data input of a dynamic level shifter 10. Each of the dynamic level shifters 10 and the static level shifters 20/21 are non-inverting, i.e. the output logic state follows the input logic state (although inversions internal to the circuit may occur).

Each of the dynamic level shifters 10 in the embodiment shown is configured to level shift signals from a lower voltage domain (Vdd1) to a higher voltage domain (Vdd2). Conversely, each of the static level shifters 20 and static level shifter 21 in the embodiment shown are configured to level shift signals from a higher voltage domain (Vdd2) to a lower voltage domain (Vdd1).

In the embodiment shown, inverters are coupled between the output of each dynamic level shifter 10 and the clock input of another dynamic level shifter 10. When the output of one of the dynamic level shifters 10 is a logic high, the inverter coupled to its output node inputs a logic low to the clock input of another one of the dynamic level shifters 10. For example, in the embodiment shown, when the output of the dynamic level shifter labeled 'DLS2' is high, a logic low is received on the clock input of the dynamic level shifter labeled 'DLS1'. Responsive to receiving a logic low on its clock input, a dynamic level shifter 10 enters the precharge phase and forces its output to a logic low. Accordingly, a logic high may propagate through a given dynamic level shifter 10 when a logic high on its data input corresponds with a logic high on the clock input.

Since each of the dynamic levels shifters 10 and static level shifters 20/21 is non-inverting, ring oscillator 10 may be in a quiescent (i.e. non-oscillating state) when initially powered on and the enable signal is low. When in the quiescent state, the output for each of the level shifters (both static and dynamic) is a logic low in this embodiment, while the clock inputs of each of the dynamic level shifters 10 is a logic high (due to the inverters). To initiate oscillation, the enable signal received by static level shifter 21 may be asserted in order to generate a pulse. Responsive to the pulse, a ripple effect may occur in ring oscillator 30 that results in its oscillation as long as the enable signal is held high.

Figure 4:
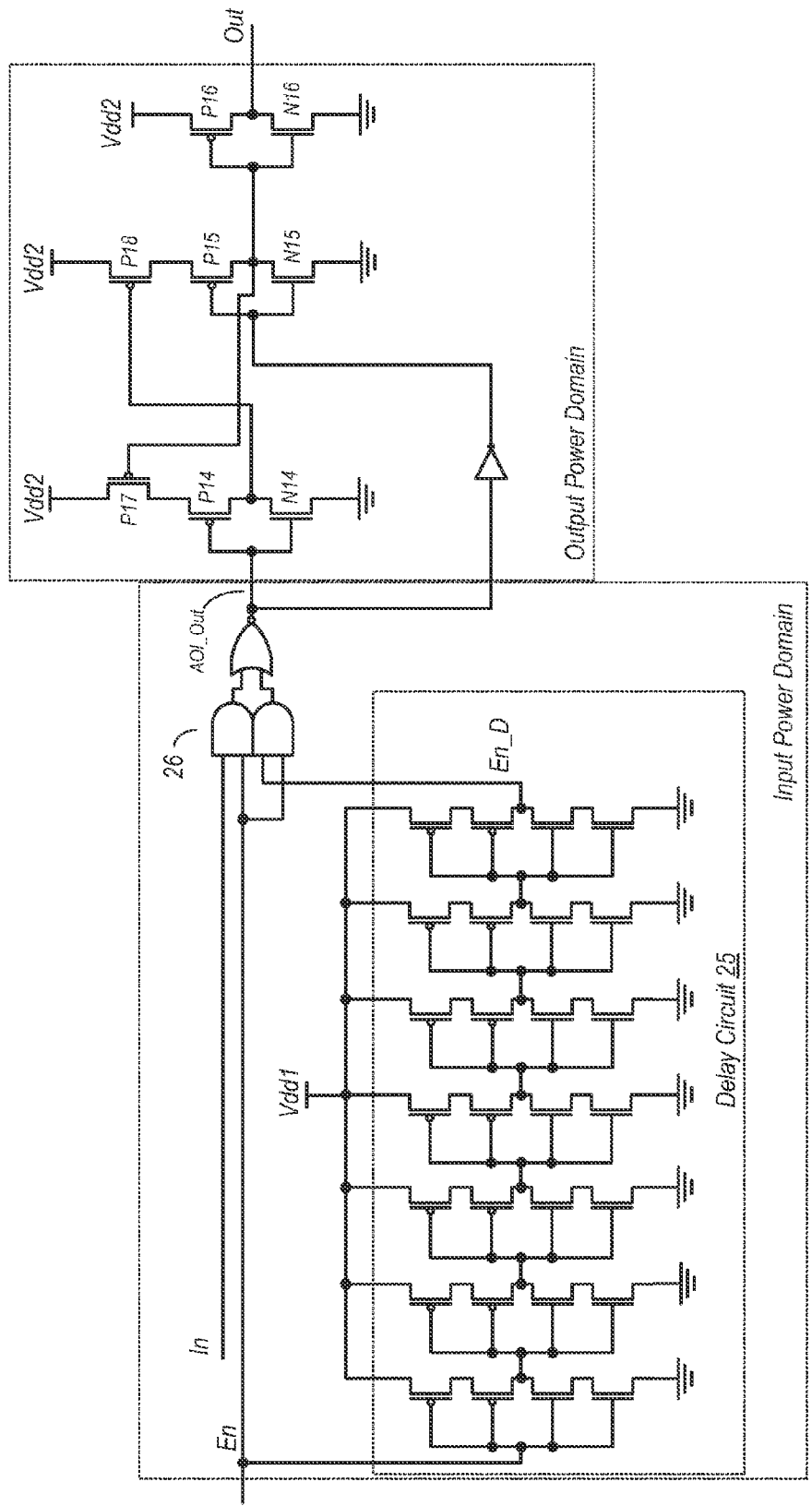
FIG. 4 is a block diagram of one embodiment of a static level shifter including a pulse generator.

FIG. 4 illustrates one embodiment of static level shifter 21. In the embodiment shown, static level shifter 21 includes input power domain circuitry and output power domain circuitry. The circuitry of the output power domain is similar to that of static level shifter 20 shown in FIG. 2. The circuitry of the input power domain in this embodiment includes a delay circuit 25, which includes an odd number of inverters. The circuitry also includes an AND-OR-Invert (AOI) circuit 26 having two AND gates and a NOR gate. Both of the AND gates are coupled to receive the enable signal, 'En'. One of the AND gates is coupled to receive a data input signal, 'In' while the other AND gate is coupled to receive the delayed version of the enable signal, 'En_D', from the delay circuit 25.

When static level shifter 21 is implemented in an embodiment of the ring oscillator 30 shown in FIG. 3, the data input signal is also initially low. In its initial state, the enable signal is low, and thus the delayed version of the enable signal is high. Accordingly, the corresponding AND gate (the lower of the two in the drawing) coupled to receive both of these signals is receiving a logic low on one input and a logic high on the other input. When the enable signal is asserted, the corresponding AND gate is receiving logic highs on both inputs, thereby causing the output of AOI circuit 21 (the node labeled 'AOI_Out') to transition from high to low. This results in the output node of the output power domain ('Out') transitioning high. The low on 'AOI_Out' and the resulting high on the output node may be held until the transition of the enable signal from low to high has propagated through delay circuit 25 to cause 'En_D' to transition from high to low. Once 'En_D' transitions from high to low, the corresponding AND gate outputs a logic 0, 'AOI_Out' transitions back to a logic 1, and the output node transitions back to a logic 0.

Returning to FIG. 3, it can be seen that the two transitions of the output node (low to high and the subsequent high to low) are provided to the input of the dynamic level shifter labeled DLS1. This transition may thus propagate through the static and dynamic level shifters of ring oscillator 30, eventually causing a transition from low to high on the input node of static level shifter 21. Since the enable signal is held high to maintain oscillation in this embodiment, the low to high transition of the input node thus causes another transition to enter the series coupled chain of level shifters, and thus oscillation continues. It is noted that each time a dynamic level shifter 10 outputs a logic high, a resulting logic low is provided to the clock input of another dynamic level shifter 10, resulting in a reset (e.g., high to low transition) of the latter. Furthermore, each time a dynamic level shifter 10 outputs a logic low, a resulting logic high is provided to the clock input of another dynamic level shifter 10, allowing it to evaluate the logic value of its input. Ring oscillator 30 in the embodiment shown is configured such that during the evaluation phase of each dynamic level shifter 10, a logic high is received on the data input. This ensures that oscillation continues when the enable signal is a logic high. Oscillation of ring oscillator 30 is discontinued when the enable signal falls low.

Figure 5:
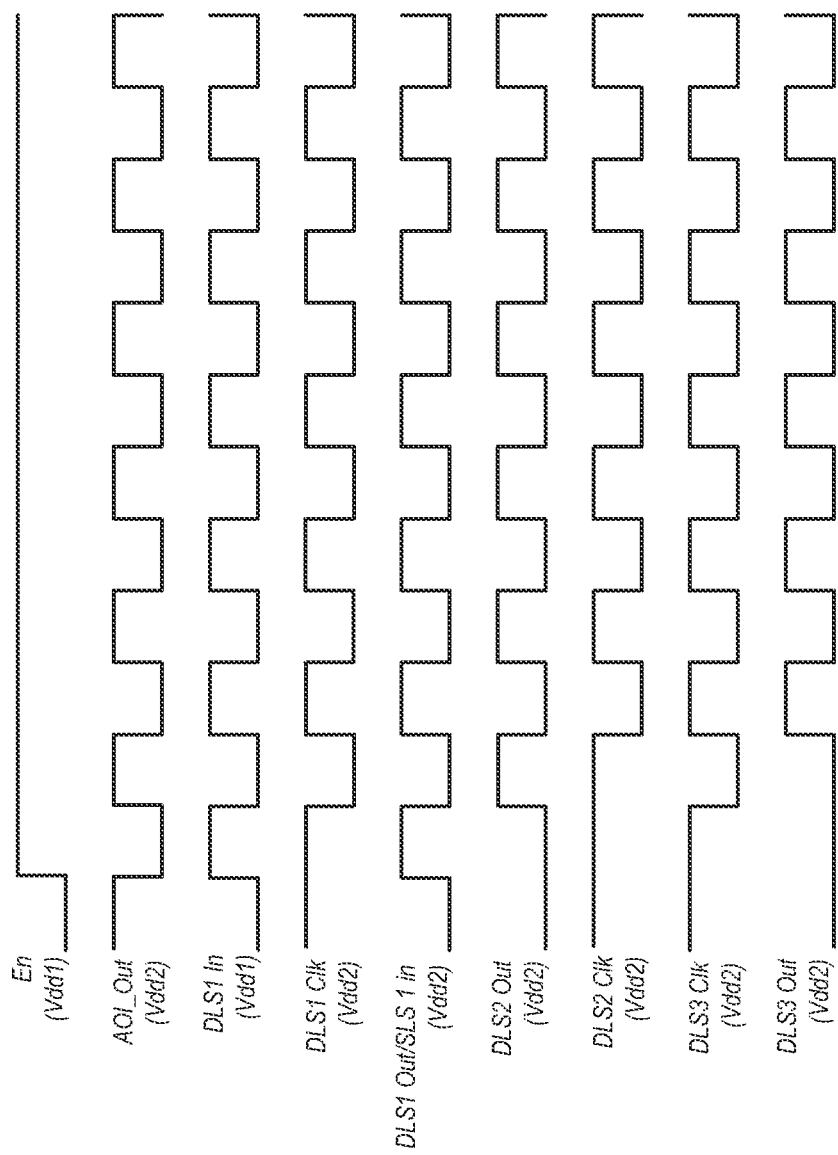
FIG. 5 is a timing diagram illustrating operation of one embodiment of a ring oscillator.

FIG. 5 is a timing diagram illustrating the operation of one embodiment of ring oscillator 30. In the illustrated example, the assertion of the enable signal (e.g., the low to high transition) initially causes 'AOI_Out' to fall low. This in turn results in static level shifter 21 providing a logic high to the input of DLS1, 'DLS1 In'. This logic high may pass through DLS1, SLS1, and to the output of DLS2. This in turn may cause DLS1 to be reset, since the high output form DLS2 is received as a low on the clock input of DLS1. Meanwhile, the high output from DLS1 is received as a low on the clock input of DLS3, thereby resetting that dynamic level shifter. Furthermore high output from DLS2 is eventually fed back as a low to the clock input of that dynamic level shifter, resetting it. When DLS2 is reset, a resulting logic high is received on the clock input of DLS1. Furthermore, the logic high initially propagated into ring oscillator 30 by the initial pulse eventually is received on the input node of SLS 21. This causes another logic high to be fed back to the data input of DLS1. The logic high on the data input of DLS1 may be received when that level shifter's clock input is high and it is thus in the evaluate phase. Thus, another logic high is passed through DLS1.

The above-described transitions eventually result in a situation where all of the signals shown in FIG. 5, with the exception of the enable signal, begin oscillating between logic high and logic low values. In general, each of the nodes connecting two different level shifters in ring oscillator 30 will oscillate between logic high and logic low values, thereby maintaining oscillation of the ring oscillator as a whole. Oscillation is maintained in the described embodiment until the enable signal is brought low.

Figure 6:
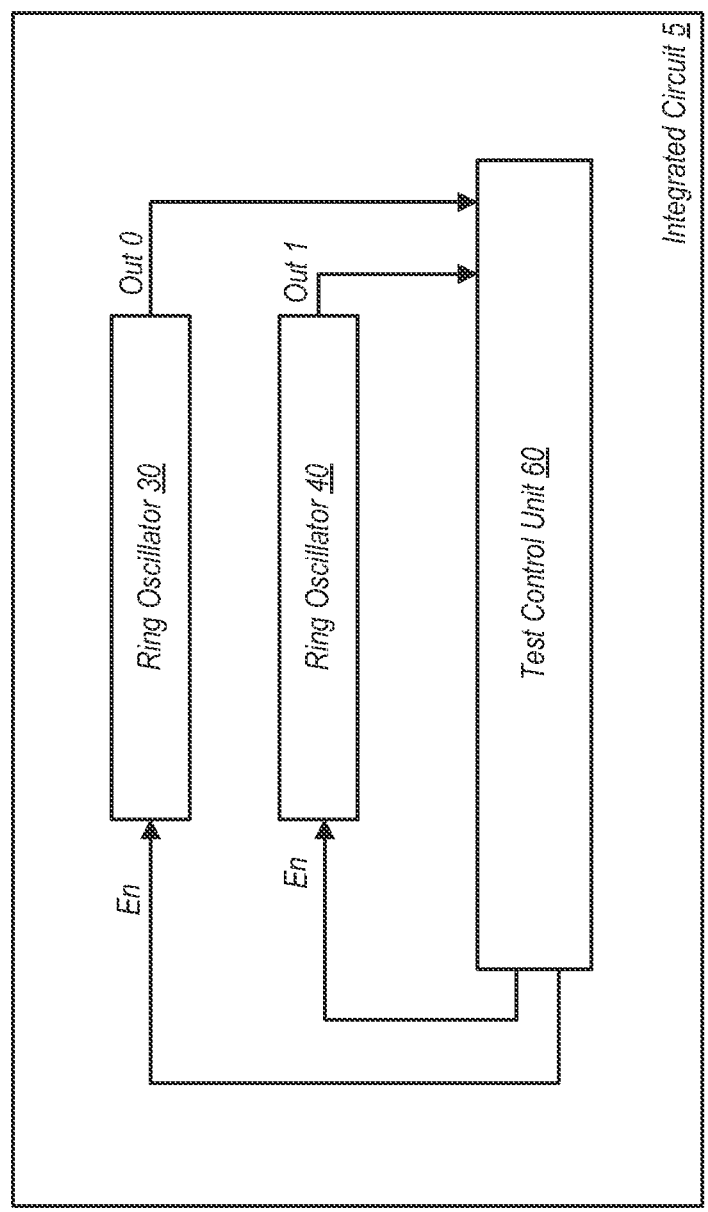
FIG. 6 is a block diagram of one embodiment of an integrated circuit including ring oscillators implemented using dynamic and/or static level shifters.

A ring oscillator implemented using dynamic level shifters such as ring oscillator 30 described above may be used to evaluation the performance of the type of dynamic level shifter used in its implementation. Turning now to FIG. 6, a block diagram of an integrated circuit having a test arrangement for evaluating the performance of dynamic level shifters relative to static level shifters. Integrated circuit 5 in the embodiment shown includes two ring oscillators. A first of these is ring oscillator 30, which may be the same or similar to the embodiment discussed above. Moreover, ring oscillator 30 may be implemented using dynamic level shifters 10 such as the embodiment discussed in FIG. 1. A second ring oscillator 40 may be implemented using only static level shifters, such as static level shifter 20 shown in FIG. 2 or variations thereof. If the static level shifters are non-inverting, an odd number of inverters may be implemented in ring oscillator 40 to guarantee oscillation.

Integrated circuit 5 also includes a test control unit 60 in the embodiment shown. Test control unit 60 may provide various functions. A first function provided by test control unit may be to initiate oscillation of ring oscillators 30 and 40 by asserting their respectively received enable signals. Another function provided by test control unit 60 in the embodiment shown is to determine the respective frequency of oscillation for each of the ring oscillators. Based on the respective frequencies of oscillation, test control unit 60 may derive an average delay through a given instance of one of the dynamic level shifters and the average delay through a given instance of one of the static level shifters. Based on determination of the average delays through, the relative performance of the two types of level shifters may be compared.

Another function that may be performed by test control unit 60 is to perform iterative testing to determine level shifter performance at various process corners. For example, multiple tests may be conducted in which at least one of the operating voltages of the dynamic level shifters is varied from iteration to iteration to another. If it is desired that the dynamic level shifters outperform the static level shifters in terms of delay (e.g., the dynamic level shifters have less delay than their static counterparts), such testing may determine, e.g., an output domain voltage at which the dynamic level shifters where this is no longer true. This may in turn be used to determine a minimum output domain voltage at which the level shifters, both static and dynamic may be operated while the dynamic level shifters still have a lower delay value than the static level shifters. Furthermore, such testing may be used to determine a point at which ring oscillator 30 no longer functions properly, which also may be used to determine a minimum operating voltage for the static level shifters.

Figure 7:
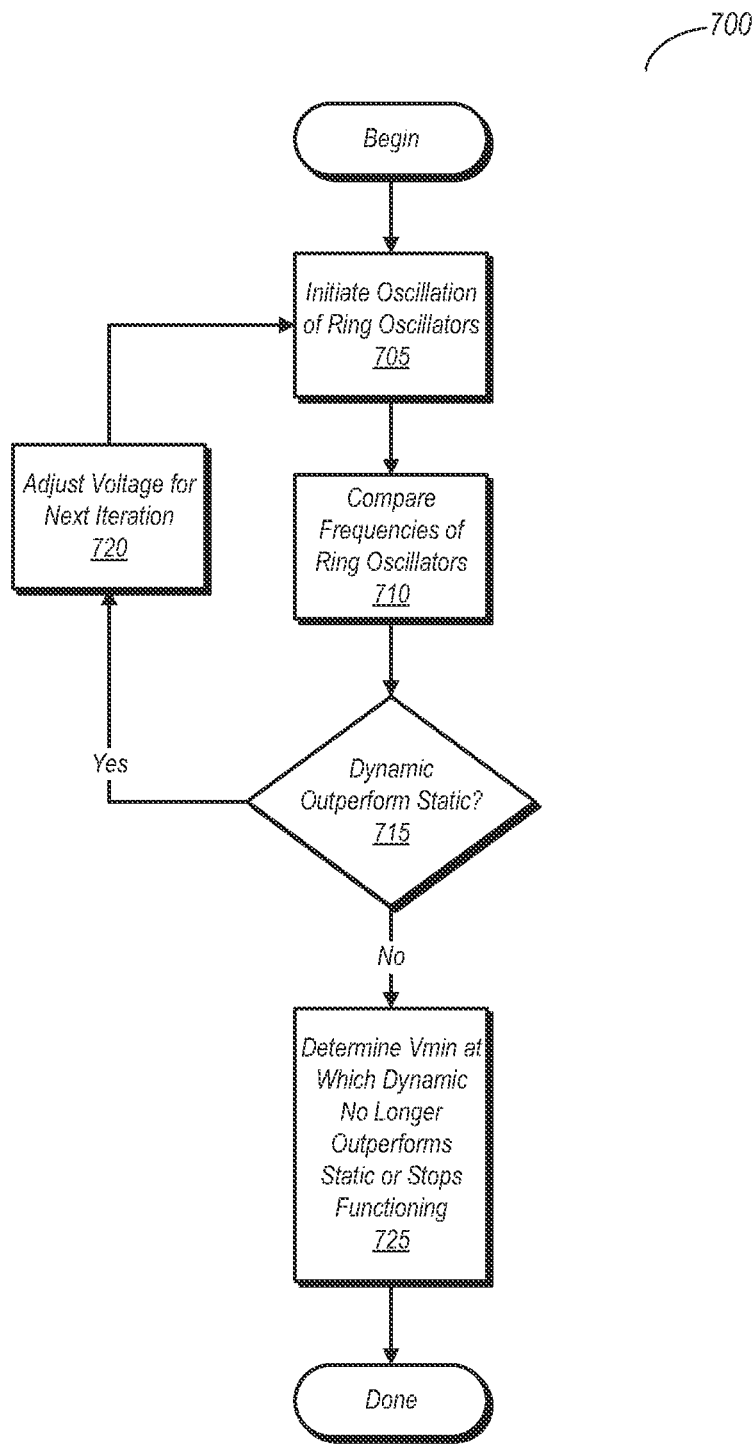
FIG. 7 is a flow diagram illustrating one embodiment of a method for testing the relative performance of dynamic and static level shifters.

Turning now to FIG. 7, a flow diagram illustrating one embodiment of a method for testing the relative performance of dynamic and static level shifters is shown. Method 700 may be performed using various embodiments of the circuitry and ring oscillators discussed above. Additionally, method 700 may be performed with circuitry/ring oscillators not explicitly discussed herein.

Method 700 begins with the initiation of oscillation of the ring oscillators used to conduct the testing (block 705). Oscillation of a first ring oscillator that includes dynamic level shifters (e.g., ring oscillator 30 as discussed above) may be initiated by asserting an enable signal to pulse generation circuitry. Oscillation of a second ring oscillator, which includes static level shifters but not dynamic level shifters, may be initiated by any suitable mechanism provided therein. It is noted that the first ring oscillator includes both dynamic and static level shifters. It is further noted that the type of static level shifters used in both oscillators may be of an identical configuration. More particularly, the static level shifters used in both ring oscillators may have an identical layout and may include transistors of substantially the same size, and in general may be as closely matched to one another as possible. The dynamic level shifters used in the first ring oscillator may also be as closely matched to one another as possible.

After oscillation for both ring oscillators has been initiated and maintained, a comparison of their respective frequencies of oscillation may be performed (block 710). Based on the frequencies of the two ring oscillators, performance information may be derived for the dynamic level shifters of the first ring oscillator relative to the static level shifters used to implement the second ring oscillator. The performance information of the two types of level shifters may then be compared. In one embodiment, a comparison may be made to determine whether the dynamic level shifters outperform (e.g., have a lower delay) the static level shifters. If the dynamic level shifter outperforms the static level shifter (block 715, yes), then at least one of its supply voltages may be adjusted (block 720) and another iteration of testing may be conducted beginning with the initiation of oscillation of the two ring oscillators (block 705). This cycle may be repeated a number of times. In one embodiment, the larger of the two voltages received by the dynamic level shifters (e.g., the output domain supply voltage of dynamic level shifter 10 as discussed above) may be incrementally reduced as additional iterations are performed. As this voltage is reduced, the delay through the dynamic level shifters may increase.

If it is determined that, at a particular voltage level (or other operating point) that the dynamic level shifters are no longer outperforming the static level shifters (block 715, no), then a minimum voltage may be determined (block 725). The minimum voltage may be the approximate voltage at which the dynamic level shifter delay becomes substantially equal to that of the static level shifter. Alternatively, the minimum voltage may be that at which the ring oscillator implemented using dynamic level shifters ceases to function, which may indicate a minimum voltage at which the dynamic level shifters may be operated.

Figure 8:
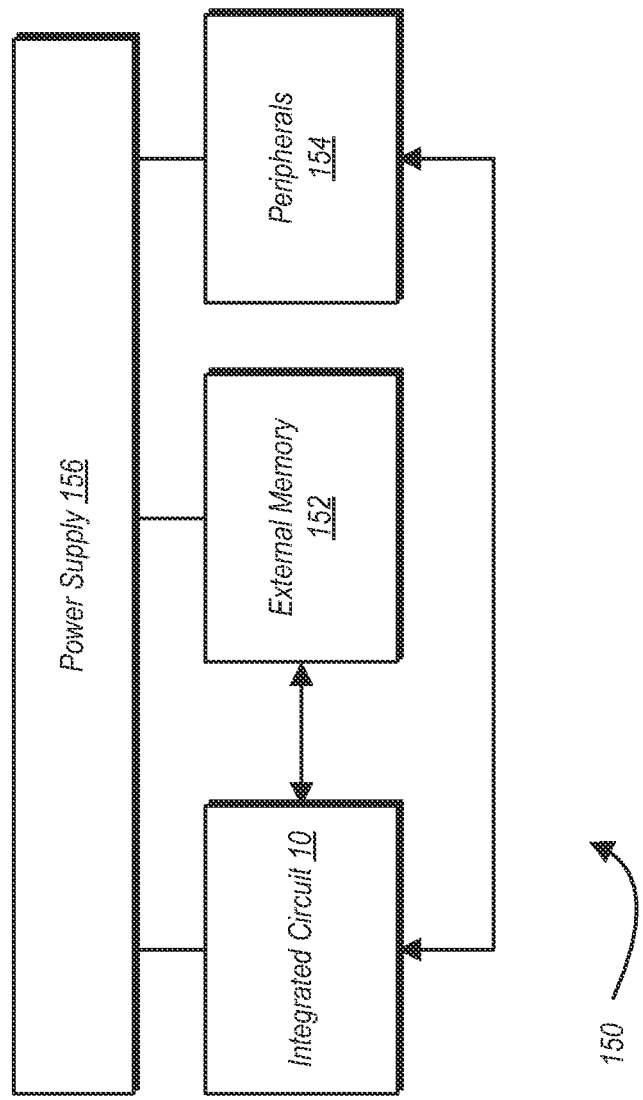
FIG. 8 is a block diagram of one embodiment of an exemplary system.

Turning next to FIG. 8, a block diagram of one embodiment of a system 150 is shown. In the illustrated embodiment, the system 150 includes at least one instance of an IC 10 (e.g., such as processor 5 of FIG. 6) coupled to one or more peripherals 154 and an external memory 152. A power supply 156 is also provided which supplies the supply voltages to the IC 10 as well as one or more supply voltages to the memory 158 and/or the peripherals 154. In some embodiments, more than one instance of the IC 5 may be included (and more than one external memory 152 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solidstate storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 152 may include any type of memory. For example, the external memory 152 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 152 may include one or more memory modules to which the memory devices are mounted, such as single inline memory modules (SIMMs), dual inline memory modules (DIMM5), etc.

Numerous variations and modifications will become apparent to those skilled in the art once the above disclosure is fully appreciated. It is intended that the following claims be interpreted to embrace all such variations and modifications.

What is claimed is:

1. A circuit comprising:
    a pull-down circuit coupled to receive a data signal and configured to pull-down a transfer node responsive to receiving the data signal at a first logic level;
    a precharge circuit having a clock input and configured to precharge the transfer node responsive to receiving a clock signal at a second logic level on the clock input;
    a pull-up circuit coupled between a supply voltage node and the transfer node and comprising a first p-type metal-oxide-semiconductor (PMOS) transistor and a second PMOS transistor, wherein the first PMOS transistor is coupled between the supply voltage node and the second PMOS transistor, wherein the first PMOS is configured to reduce current flow through the pull-up stack responsive to receiving the data signal at the first logic level.

2. The circuit as recited in claim 1, further comprising a half-keeper circuit including an inverter having an input coupled to the transfer node and an output coupled to a gate terminal of the second PMOS transistor, wherein the second PMOS transistor is coupled between the first PMOS transistor and the transfer node.

3. The circuit as recited in claim 1, wherein the pull-down circuit includes a first n-type metal-oxide-semiconductor (NMOS) transistor coupled to receive the data signal, and a second NMOS transistor coupled to receive the clock signal, wherein the pull-down circuit is configured to be deactivated when the clock signal is at the second logic level.

4. The circuit as recited in claim 1, further comprising an inverter coupled between the transfer node and an output node.

5. The circuit as recited in claim 1, wherein the first PMOS transistor is configured to remain active when the data signal is received at the first logic level.

6. A ring oscillator comprising:
    a plurality of dynamic level shifters;
    a plurality of static level shifters, wherein an output node of each of the static level shifters is coupled to a data input node of each of the dynamic level shifters;
    wherein a selected one of the static level shifters includes a pulse generator coupled to an output of one of the dynamic level shifters, wherein the pulse generator is configured to initiate oscillation of the ring oscillator responsive to receiving an enable signal.

7. The ring oscillator as recited in claim 6, further comprising a plurality of inverters each coupled to receive a respective output signal from one of the plurality of dynamic level shifters and further coupled to provide an input signal to a clock input of another one of the plurality of dynamic level shifters.

8. The ring oscillator as recited in claim 6, wherein each of the dynamic level shifters is configured to transfer a signal from a lower voltage domain to a higher voltage domain, and wherein each of the static level shifters is configured to transfer a signal from the higher voltage domain to the lower voltage domain.

9. The ring oscillator as recited in claim 6, wherein each of the plurality of dynamic level shifters are non-inverting.

10. The ring oscillator as recited in claim 6, wherein each of the dynamic level shifters includes:
    a pull-up circuit configured to pull a transfer node toward a voltage on a supply voltage node;
    a precharge circuit configured to pull the transfer node toward the voltage on the supply voltage node responsive to receiving a clock signal at a logic low voltage; and
    a pull-down circuit configured to pull the transfer node down toward a ground voltage responsive to receiving an input signal at a logic high voltage concurrent with the clock signal being at a logic high voltage.

11. A method comprising:
    operating a first ring oscillator, wherein the first ring oscillator includes a first plurality of static level shifters;
    operating a second ring oscillator, wherein the second ring oscillator a plurality of dynamic level shifters and a second plurality of static level shifters;
    comparing a frequency of oscillation of the first ring oscillator to a frequency of oscillation of the second ring oscillator; and
    determining an average delay of the dynamic level shifters relative to an average delay of the static level shifters based on comparing the frequency of oscillation of the first ring oscillator and the frequency of oscillation of the second ring oscillator.

12. The method as recited in claim 11, wherein each of the plurality of dynamic level shifters and each of the first and second pluralities of static level shifters are coupled to receive a first operating voltage and a second operating voltage, and wherein the method further comprises:
    reducing the first operating voltage; and
    repeating said operating the first ring oscillator, operating the second ring oscillator, and said comparing and said reducing until determining a minimum value of the first voltage at which the dynamic level shifters have a delay greater than or equal to a delay of the static level shifters.

13. The method as recited in claim 12, wherein the first operating voltage is greater than the second operating voltage.

14. The method as recited in claim 11, wherein each of the plurality of dynamic level shifters and each of the second plurality of static level shifters are non-inverting, and wherein the method further comprises providing an enable signal to a pulse generator to initiate oscillation of the second ring oscillator.

15. The method as recited in claim 12, wherein each of the plurality of dynamic level shifters includes:
    a pull-up stack configured to, when active pull a intermediate node toward the first operating voltage, wherein the pull-up stack includes a first transistor coupled to receive an input signal and second transistor coupled between the first transistor and the intermediate node;
    a pull-down stack configured to, when active pull the intermediate node toward a ground voltage; and a precharge transistor configured to precharge the intermediate node;

wherein the first transistor is coupled to reduce the current flow in the pull-up stack responsive to receiving the input signal at a logic high level.

16. An integrated circuit comprising:

a first ring oscillator comprising a plurality of dynamic level shifters and a first plurality of static level shifters;

a second ring oscillator comprising a second plurality of static level shifters; and a comparison circuit configured to compare a frequency of oscillation of the first ring oscillator to a frequency of oscillation of the second ring oscillator, wherein the comparison circuit is further configured to compare an average delay of the dynamic level shifters to an average delay of the second plurality of static level shifters based on their respective frequencies of oscillation.

17. The integrated circuit as recited in claim 16, wherein the comparison unit is further configured to determine a minimum output voltage at which the dynamic level shifters have a delay that is less than or equal to a delay of the static level shifters.

18. The integrated circuit as recited in claim 16, wherein a first subset of the second plurality of static level shifters are configured to level shift a received signal from a low voltage domain to a high voltage domain, and wherein a second subset of the second plurality of static level shifters is configured to level shift a received signal from the high voltage domain to the low voltage domain.

19. The integrated circuit as recited in claim 16, wherein each of the plurality of dynamic level shifters is configured to level shift a received signal from a low voltage domain to a high voltage domain, and wherein each of the first plurality of static level shifters is configured level shift a received signal from the high voltage domain to a low voltage domain.

20. The integrated circuit as recited in claim 16, wherein each of the plurality of dynamic level shifters and each of the first plurality of static level shifters are non-inverting level shifters.

21. A method comprising:

asserting and providing an enable signal to a pulse generator;

generating a first transition of a signal responsive to assertion of the enable signal;

generating a second transition of the signal at a delay time subsequent to the assertion of the enable signal;

causing a ring oscillator to oscillate responsive to generating the first and second transitions of the signal, wherein the ring oscillator includes a plurality of dynamic level shifters and a plurality of static level shifters;

wherein the ring oscillator includes a plurality of dynamic level shifters and a plurality of static level shifters, wherein the method further comprises providing an output signal from each of the static level shifters to a data input of a corresponding one of the dynamic level shifters.

22. The method as recited in claim 21, further comprising providing an inverted output of each of the dynamic level shifters to a clock input of another one of the dynamic level shifters.

23. The method as recited in claim 21, further comprising providing an output signal from the pulse generator to a selected one of the static level shifters, and providing a an output signal from a selected one of the dynamic level shifters to a data input of the pulse generator.

24. The method as recited in claim 21, further comprising maintaining oscillation of the ring oscillator by maintaining assertion of the enable signal, and discontinuing oscillation of the ring oscillator by de-asserting the enable signal.

* * * * *

UNITED STATES PATENT AND TRADEMARK OFFICE
CERTIFICATE OF CORRECTION

| | | |
|---|---|---|
| PATENT NO. | : 8,912,853 B2 | Page 1 of 1 |
| APPLICATION NO. | : 13/523055 | |
| DATED | : December 16, 2014 | |
| INVENTOR(S) | : James E. Burnette et al. | |

It is certified that error appears in the above-identified patent and that said Letters Patent is hereby corrected as shown below:

In the Claims:

Claim 23, Column 12, Line 28, please delete "a an" and substitute -- an --

Signed and Sealed this
Ninth Day of June, 2015

Michelle K. Lee
*Director of the United States Patent and Trademark Office*